(12) United States Patent
Park et al.

(10) Patent No.: US 11,923,809 B2
(45) Date of Patent: *Mar. 5, 2024

(54) ULTRA COMPACT MULTI-BAND TRANSMITTER WITH ROBUST AM-PM DISTORTION SELF-SUPPRESSION TECHNIQUES

(71) Applicant: Intel Corporation, Santa Clara, CA (US)

(72) Inventors: Jong Seok Park, Hillsboro, OR (US); Yanjie Wang, Hillsboro, OR (US); Stefano Pellerano, Beaverton, OR (US); Christopher D. Hull, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/821,200

(22) Filed: Aug. 22, 2022

(65) Prior Publication Data

US 2022/0399857 A1    Dec. 15, 2022

Related U.S. Application Data

(63) Continuation of application No. 17/000,473, filed on Aug. 24, 2020, now Pat. No. 11,424,722, which is a
(Continued)

(51) Int. Cl.
*H03F 1/32*        (2006.01)
*H03F 1/02*        (2006.01)
(Continued)

(52) U.S. Cl.
CPC ......... *H03F 1/3205* (2013.01); *H03F 1/0261* (2013.01); *H03F 1/0277* (2013.01);
(Continued)

(58) Field of Classification Search
CPC .... H03F 1/3205; H03F 1/0261; H03F 1/0277; H03F 1/223; H03F 1/565; H03F 3/189;
(Continued)

(56) References Cited

U.S. PATENT DOCUMENTS 5,933,055 A    8/1999  Dosho
9,219,445 B2   12/2015 Nobbe et al.
(Continued)

FOREIGN PATENT DOCUMENTS

CN    1871745 A    11/2006
CN    1983710 A     6/2007
(Continued)

OTHER PUBLICATIONS

Tang, C. et al.: "Post nonlinear interference cancelation algorithm in satellite communication", Journal of Xidian University, vol. 52, No. 1, p. 207-212, Feb. 2015.

*Primary Examiner* — Linda Wong
(74) *Attorney, Agent, or Firm* — 2SPL Patent Attorneys PartG mbB; Kieran O'Leary

(57) ABSTRACT

A communication device includes a power amplifier that generates power signals according to one or more operating bands of communication data, with the amplitude being driven and generated in output stages of the power amplifier. The final stage can include an output passive network that suppresses suppress an amplitude modulation-to-phase modulation (AM-PM) distortion. During a back-off power mode a bias of a capacitive unit of the output power network component can be adjusted to minimize an overall capacitance variation. An output passive network can further generate a flat-phase response between dual resonances of operation.

20 Claims, 8 Drawing Sheets

Related U.S. Application Data continuation of application No. 16/519,082, filed on Jul. 23, 2019, now Pat. No. 10,778,154, which is a continuation of application No. 15/877,879, filed on Jan. 23, 2018, now Pat. No. 10,381,986, which is a continuation of application No. 15/068,179, filed on Mar. 11, 2016, now Pat. No. 9,887,673.

(51) Int. Cl.

| | | |
|---|---|---|
| *H03F 1/22* | (2006.01) | |
| *H03F 1/56* | (2006.01) | |
| *H03F 3/189* | (2006.01) | |
| *H03F 3/193* | (2006.01) | |
| *H03F 3/21* | (2006.01) | |
| *H03F 3/24* | (2006.01) | |
| *H03F 3/45* | (2006.01) | |
| *H03F 3/68* | (2006.01) | |
| *H03F 3/72* | (2006.01) | |
| *H04B 1/04* | (2006.01) | |
| *H04L 27/34* | (2006.01) | |

(52) U.S. Cl.
CPC ............ *H03F 1/223* (2013.01); *H03F 1/565* (2013.01); *H03F 3/189* (2013.01); *H03F 3/193* (2013.01); *H03F 3/211* (2013.01); *H03F 3/24* (2013.01); *H03F 3/245* (2013.01); *H03F 3/45188* (2013.01); *H03F 3/68* (2013.01); *H03F 3/72* (2013.01); *H04B 1/04* (2013.01); *H04L 27/34* (2013.01); *H03F 2200/111* (2013.01); *H03F 2200/162* (2013.01); *H03F 2200/18* (2013.01); *H03F 2200/387* (2013.01); *H03F 2200/423* (2013.01); *H03F 2200/429* (2013.01); *H03F 2200/451* (2013.01); *H03F 2200/541* (2013.01); *H03F 2201/3203* (2013.01); *H03F 2203/21139* (2013.01); *H03F 2203/21142* (2013.01); *H03F 2203/21178* (2013.01); *H03F 2203/7206* (2013.01); *H03F 2203/7209* (2013.01); *H03F 2203/7236* (2013.01); *H04B 2001/0408* (2013.01)

(58) Field of Classification Search
CPC . H03F 3/193; H03F 3/211; H03F 3/24; H03F 3/245; H03F 3/45188; H03F 3/68; H03F 3/72; H03F 2200/111; H03F 2200/162; H03F 2200/18; H03F 2200/387; H03F 2200/423; H03F 2200/429; H03F 2200/451; H03F 2200/541; H03F 2201/3203; H03F 2203/21139; H03F 2203/21142; H03F 2203/21178; H03F 2203/7206; H03F 2203/7209; H03F 2203/7236; H04B 1/04; H04B 2001/0408; H04L 27/34
See application file for complete search history.

(56) References Cited

U.S. PATENT DOCUMENTS

| | | |
|---|---|---|
| 2011/0070848 A1 | 3/2011 | Ramachandra Reddy |
| 2011/0260797 A1 | 10/2011 | Lee |
| 2014/0112414 A1 | 4/2014 | Lu et al. |
| 2015/0349732 A1* | 12/2015 | Leong ............... H03F 3/193 |
| | | 330/253 |

FOREIGN PATENT DOCUMENTS

| | | |
|---|---|---|
| CN | 101656509 A | 2/2010 |
| CN | 102427339 A | 4/2012 |
| CN | 103532503 A | 1/2014 |
| CN | 103748785 A | 4/2014 |
| CN | 104185955 A | 12/2014 |
| CN | 105376660 A | 3/2016 |
| CN | 104716906 A | 6/2017 |
| KR | 20150001800 A | 1/2015 |

\* cited by examiner

ULTRA COMPACT MULTI-BAND TRANSMITTER WITH ROBUST AM-PM DISTORTION SELF-SUPPRESSION TECHNIQUES

CROSS-REFERENCE TO RELATED APPLICATIONS

This application is a continuation of U.S. application Ser. No. 17/000,473 filed on Aug. 24, 2020. The '473 application was a continuation of U.S. application Ser. No. 16/519,082 filed on Jul. 23, 2019. The '082 application was a continuation of U.S. application Ser. No. 15/877,879 filed on Jan. 23, 2018. The '879 application was a continuation of U.S. application Ser. No. 15/068,179 filed on Mar. 11, 2016. The contents of the earlier filed applications are incorporated by reference herein in their entirety.

BACKGROUND

Modern wireless systems utilize multi-band and multi-mode operations to simultaneously support multiple different communication standards. These rapidly growing demands have posed tremendous challenges for future radio frequency RF transmitter development and especially power amplifiers One popular solution for multi-band PAs is to directly assemble several single-band PAs either in a chip or on a multiple-chip module. This approach, however, can have several drawbacks, such as large chip/module area, increased cost, dedicated antenna interface to each PAs, possible need of off-chip switches and complicated packaging. Tunable passive networks can also be utilized to achieve multi-band impedance matching and power combining for RF PAs. Those tunable components often pose a direct trade-off among passive loss and frequency range and suffer from reliability concerns of tunable components such as varactors and a switch-cap banks.

DETAILED DESCRIPTION

Figure 1:
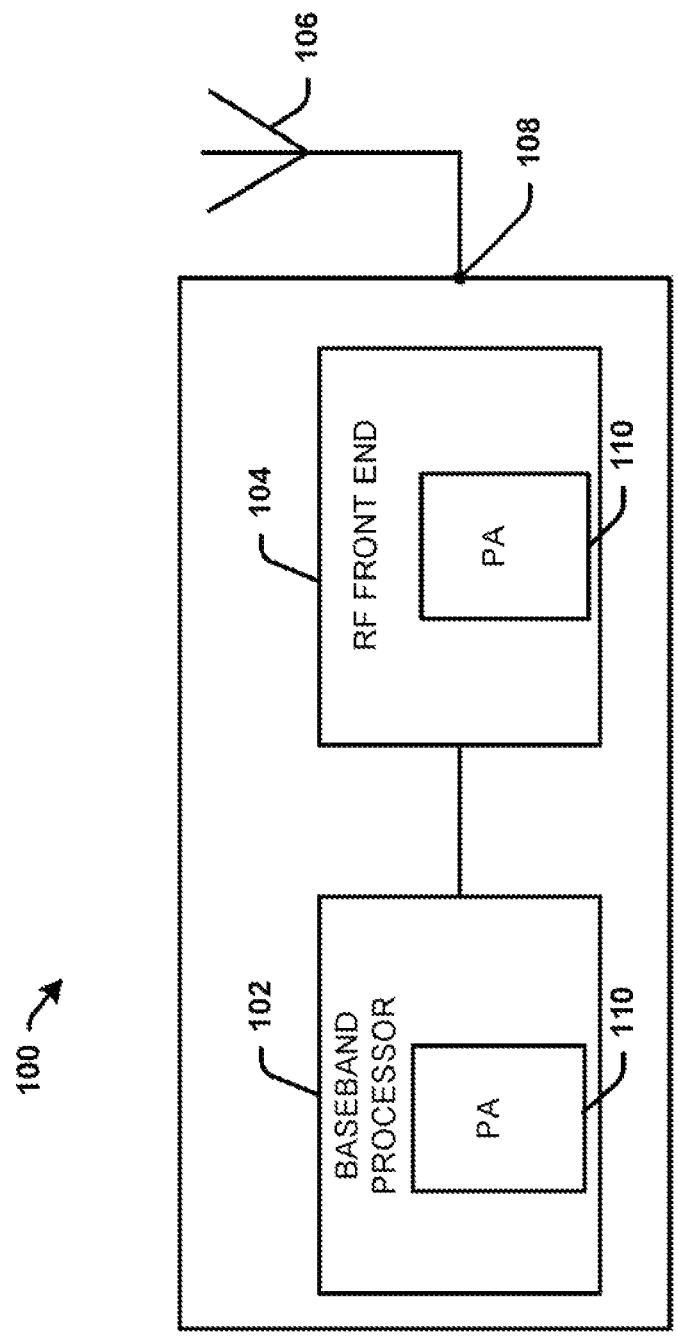
FIG. 1 illustrates an exemplary communication device comprising at least an exemplary power amplifier in accordance with various aspects described.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, an electronic circuit and or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles and as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies and continued objectives, various aspects for a multi-band communication device, such as a transmitter that can be a highly linear dual-band mixed-signal polar power amplifier architecture, can offer a fully integrated single-chip solution in bulk CMOS technology while eliminating or significantly reducing amplitude modulation to phase modulation distortions being generated in the power amplification stages. Embodiments herein disclose a power amplifier with self-suppression or self-compensation bias scheme techniques for communication/mobile devices that involve simultaneous dual-band operation, load-pull impedance matching, parallel power combining and even-order harmonic rejection to maximize power amplifier efficiency with one compact on-chip transformer without any tunable passive elements or switches.

A communication device, for example, can be a transmitter or transceiver of a mobile phone, or other mobile communicating system that can include a power amplifier that self-mitigates phase distortion as part of the amplification modulation, which can he referred to as amplitude modulation to phase modulation (AM-PM) distortion. AM-PM distortion can refer to a form of nonlinear phase distortion caused by nonlinear characteristics of a circuit component (e.g., a power amplifier) as a function of the input amplitude. As the input amplitude is modulated, the phase modulation of the output can behave in a nonlinear manner and then cause increased out-of-band noise, as well as an increase in error vector magnitude (EVM).

The power amplifier system being disclosed, for example, can operate to utilize the inherent parasitic capacitances of the output stage (output passive network) of the power amplifier to minimize the overall capacitance variation responsible for the phase distortion. For example, a power amplifier with a plurality of unit power amplifier cells can receive driver signals according to an operating band of input signals being processed, and an output passive network can combine signals from each unit power amplifier cell, delivering the power to an antenna or antenna port, and further suppressing an AM-PM distortion by utilizing flat-phase response of a multi-resonance structure.

The unit power amplifier cells can include several capacitive units in parallel, which are absorbed by the output passive network and become a part of output passive network. The capacitors can be integrated as part of the different unit power amplifier cells for capacitances across various transistor terminals therein. For example, these capacitors can be across the drain, source and gate terminal of transistors of each unit power amplifier cells, and can be charged and discharged in response to the course of power amplifier. During power back-off mode, certain capacitive cells can be manipulated with a suppression component having transistors that operate at predetermined modes of operation to activate or deactivate. The parasitic capacitances being generated can thus be further controlled in a way that mitigates the AM-PM distortion at the output of the power amplifier with the output passive network in order to implement a self-suppression scheme for suppression of inherent parasitic capacitances causing phase distortion.

In addition, the output passive network of the power amplifier can be coupled to or integrated with the power amplifier as a multi-resonance network to perform impedance matching, power combining, even harmonics suppression and differential to single-ended conversion across a wide frequency range (one octave) with a single transformer footprint. Additional aspects and details of the disclosure are further described below with reference to figures.

Referring to FIG. 1, illustrated is an exemplary communication or mobile device 100 comprising a power amplifier in accordance with various aspects being described. The communication device 100 can comprise a mobile or wireless device, for example, and can further include a digital baseband processor 102, an RF frontend 104 and an antenna port 108 for connecting to an antenna 106. The device 100 can comprise an exemplary power amplifier 110 as a part of the digital baseband processor 102 or the RF frontend 104. The digital baseband processor 102 or the RF frontend 104 can comprise such a power amplifier 110 or multiple power amplifiers operating or coupled in parallel. The RF frontend 104 can be coupled to the digital baseband processor 102 and the antenna port 108, which is configurable with the antenna 106.

In one aspect, the power amplifier 110 can operate to provide a power signal along a transmitter path for transmissions according to various operating bands. The power amplifier 110 can operate in multi-band or multi-mode operations to simultaneously support multiple communication standards with various operating bands. Rapidly growing demands have posed challenges for future radio frequency) transmitter development, especially power amplifiers. One solution for a multi-band power amplifier can be to directly assemble several single-band PAs either in a chip or on a multiple-chip module. However, this can possibly incur large chip/module area, increased cost, a dedicated antenna interface to each power amplifier, possibly the need for off-chip switches or complicated packaging. Additionally, tunable passive networks can also be utilized to achieve multi-band impedance matching and power combining for RF power amplifiers. However, these solutions suffer from the direct trade-off among passive loss and tuning range as well as the reliability concerns. To address at least some of these issues, the power amplifier 110 can comprise a highly linear dual-band mixed-signal polar power amplifier architecture, which offers a fully integrate single-chip solution in bulk CMOS technology according to various aspects or embodiments described.

In one example, the power amplifier 110 can comprise a plurality of power amplifiers components or unit power amplifier cells, each configured to provide the power signal along the transmitter path (e.g., path to antenna port 108) based on driver signals being received according to one or more operating bands or frequencies. The power amplifier 110 can be further integrated to an output passive network that can be a matching network component. This output stage can combine power signals processed from the different unit power amplifier cells components of the power amplifier 110. This output passive network of the power amplifier 110, for example, can further operate to suppress an AM-PM distortion or phase distortion at an output based on or as a function of the power amplifier 110 operating in a back-off power mode or a saturation power mode. As such, the output passive network of the power amplifier component 110 can utilize the flat-phase response across the wide frequency range to achieve robust phase response against to the non-linear output capacitance variation of the power amplifier. For example, the power amplifier component 110 can operate to adjust a bias of any number of the unit power amplifier cell components of the power amplifier 110 to minimize an overall drain capacitance variation of along a full operating power range of operation or operational frequency range of operation. As such, the output passive network of the power amplifier 110 can operate as a multi-resonance network to perform impedance matching, power combining, even harmonics suppression and differential to single-ended conversion across a wide frequency range (one octave) with a single transformer footprint. The output passive network (matching resonance network component) of the power amplifier component 110 can further provide a flat-phase response across a wide bandwidth, so that a change in output capacitance leads to minimum signal phase change. Thus, the power amplifier 110 can generate an excellent AM-PM performance across a wide bandwidth.

Figure 2:
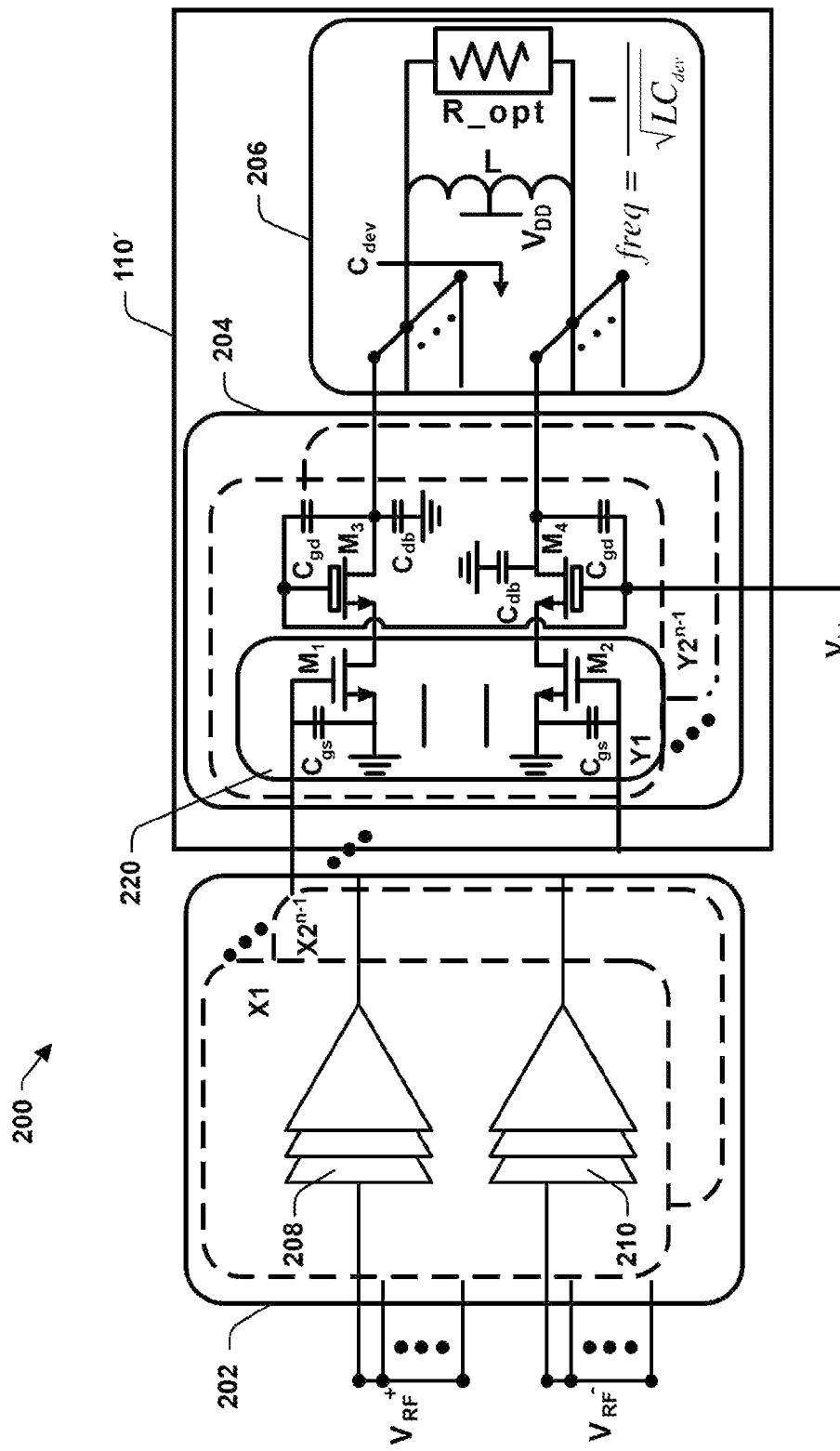
FIG. 2 illustrates an exemplary drive circuit and power amplifier in accordance with various aspects described.

Referring to FIG. 2, illustrated is an example communication system with a power amplifier (PA) 110' in accordance with various aspects or embodiments. The PA 110' (e.g., a CMOS power amplifier or other PA) can comprise a driver stage component 202, unit PA cell component(s) 204, and an output passive network or an impedance matching network 206 for generating a power signal for transmissions involved in multi-band (e.g., uplink and downlink frequency operating bands) and multi-mode operations concurrently with different communication standards LTE, 3GPP, etc. The PA 110' can generate AM-PM self-suppression to output signals, which exploits the inherent output power stage parasitic capacitance to compensate the non-linear capacitance variation. The output passive network 206 can further operate as a multi-resonant matching network with flat-phase response is also used to minimize residual AM-PM distortion throughout operation of the PA 110' over the back-off mode of operation and a saturation mode of operation. For example, the 110' can operate to generate an minimized AM-PM distortion or phase distortion due to the non-linear capacitance of one or more unit PA cells, such as by mitigating one or more parasitic capacitances coupled to one or more transistors (e.g., M1-4 as PMOS, NMOS or another transistor type) of each activated unit PA cell 204.

The driver stage 202 comprises one or more driver stage components $X1$-$X2^{n-1}$ along one or more single or differential drive paths for generating driver signals for power amplification at the PA 110'. The driver stage components X1-X2$^{n-1}$ process electronic signals (e.g., radio frequency (RF) voltage signals, V$_{RF}^-$, V$_{RF}^+$, or the like), and provide a regulated drive signal to the unit PA cell components 204. The driver stage component(s) 202 can each include one or more comparators or amplifiers 208 and 210 associated with a differential drive path, respectively. The driver stage 202 can operate to regulate or control the unit PA cell components 204 by providing bias signals or driver signals to gates of the transistors (e.g., M1 and M2) as well provide a voltage bias (Vbias) to the gates of the thick oxide transistors M3 and M4, for example, according to different modes of operation (e.g., a saturation mode, a back-off power mode) and as a function of one or more different operating bands being processed according to the application of the PA 110'. A drive signal can thus maintain operation of subsequent stages of the 110' according to different characteristics of the unit PA cell components 204.

In one example, the unit PA cell components 204 power/driver signals from the driver stage components 202 for operating one or more transistors M3 and M4 in a back-off mode and a saturation mode. The back-off mode can refer herein to a decrease in power being supplied or provided at the unit PA cell components 204 or any group of transistors, such as M3 and M4 together. The saturation mode can refer to an increase in power where the PA components each unit PA cell component 204, the PA component 204, transistor M3 or transistor M4) are fully operational or powered, such as above a threshold voltage for thick oxide transistors M3 and M4, or the transistors M1 and M4. Although the PA 110' is illustrated with differential paths, a single transmission path can also be envisioned as one or ordinary skill in the art could appreciate.

The PA 110' could generate AM-PM distortion or phase distortion as a result of changes in the amplitude as well as the fluctuation of various capacitances of the unit PA cell components 204, such as from the capacitances Cgs, Cgd, and Cdb. The capacitors Cgs provides a capacitance across the source terminal and the gate terminal, which receives driver signals for driving or powering the transistors M3 and M4. The capacitors Cgd of the unit PA cell components 204 provides a capacitance between the gate terminal and drain terminals of transistors M3 and M4. The transistors M3 and M4 can comprise thick-oxide transistors that have a thicker oxide layer than the transistors M1 and M2 comprising thin-oxide transistors The transistors M3 and M4 can comprise thick-oxide transistors that have a thicker oxide layer than the transistors M1 and M2 comprising thin-oxide transistors having a smaller or thinner oxide layer. For the PA 110' cascade topology as illustrated in FIG. 2, the capacitors Cgd of the thick-oxide transistors M3 and M4 can be the main contributors of the AM-PM distortion of the PA 110' as capacitors Cgd can be more non-linear with respect to the power voltage swing level and further are directly loaded at the output passive network 206 of the PA 110'. This non-linear capacitance Cgd loading to the output passive network 206 of PA 110' can shift the resonance frequency of the output passive network 206 of the PA 110' (resonance frequency can normally be tuned at the maximum power level), resulting in the phase distortion according to the output power level (as in AM-PM distortion). The capacitance of capacitor Cgd can be related to the width (W) and length (L) of the transistor device (e.g., M3, M4), the gate-drain overlap capacitance per unit width (Cov) and the total gate capacitance (Cgg).

One way to address the AM-PM phase distortion generated from the power amplifier component 110' is to compensate the phase distortion of the unit PA cells 204 at the driver stages 202 using a varactor or capacitor bank based on a look-up table. However, additional memory and processor power could be utilized, which increases the cost and reduces the overall power efficiency, which is especially true for wideband modulated signals (>20 MHz). Therefore, the unit PA cell components 204 or output power stage 204 comprises a self-compensating function (e.g., a suppression component) with respect to the non-linear capacitance variations, without introducing extra components: as the power is reduced, the bias of the unit PA cells 204 while in a turned off state (back-off mode) can be adjusted to minimize the overall drain capacitance variation.

In one embodiment, as the voltage swing at the drain node of M3 and M4 is increasing (PA power increasing), the cascade transistors (M3 and M4) or the thick oxide transistors are operated for a longer time in the triode region or mode of operation where each capacitor Cgd presents a larger capacitance (W×Cov+W×L×Cgg/2) than the capacitances of each Cgd being operated in a saturation region (W×Cov) or mode of operation. In other words, when the PA 110' output power is decreasing (back-off mode of operation), the PA 110' effective capacitance (Cdev) at the drain of the cascade transistors (M3 and M4) is decreasing.

In one embodiment, the output power network 204 can self-compensate for the phase distortion for an effective capacitance reduction at the power back-off mode of the PA 110', without additional components, by utilizing the parasitic capacitance Cds of the cascade transistors (M3 and M4) via the suppression component 220 comprising transistors M1 and M2, for example. Rather than compensating for the phase distortion of the PA 110' at the driver stages, such as by using a varactor or capacitor bank together with a look-up table, the unit PA cell components 204 can utilize its own components to self-compensate or mitigate phase distortion. The suppression component utilizes an inherent parasitic capacitance of the power amplifier component 220 to self-compensate a nonlinear capacitance variation at the output.

For example, each of the unit PA cells 204 can include corresponding unit PA cells Y1-Y2$^{n-1}$ that can operate in a power-on and a power-off mode depending upon a change in. As such, during operation the unit PA cells Y1-Y2$^{n-1}$ with transistors M3 and M4 can fluctuate between increasing in power during a power-on phase or mode and a power-off phase or mode of operating. The power-on mode can comprise saturation mode, for example, in which the PA and any number of output power networks Y1-Y2$^{n-1}$ of the output power stage 204 are being fully powered.

Additionally, the power-off phase or mode can be the back-off mode where power is being decreased or the output power network of the unit PA cell components 204 is powered down or off. Incidental to this operation, parasitic capacitance is still being generated, but this parasitic capacitance is not affecting the output because the capacitors Cds can be effectively floating during the back-off mode of operation since both the thin oxide transistors M1 and M2 are powered off.

The suppression component 220 can include the transistors M1 and M2, for example. The suppression component 220 can operate to adjust a bias of transistors of M1, M2, M3, and M4. The capacitor or capacitive unit of Cds across the drain and source of the thick oxide transistors M3 and M4 of each unit PA cell components 204 of Y1-Y2$^{n-1}$ are manipulated to minimize an overall capacitance variation in the back-off power mode. The parasitic capacitance of the PA 110' or one or more unit PA cells 204 can have a nonlinear behavior with respect to a power level where the effective parasitic capacitance is decreasing as power is decreasing. Therefore, the parasitic capacitance varies between the different modes of a back-off mode and a saturation mode of operation. The self-suppression or self-compensation bias scheme generated by the suppression component can linearize the non-linear parasitic capacitance behavior of the PA 110'. The suppression component 220 thus enables a continued base line operation and minimizes an overall capacitance variation to reduce the phase distortion being generated due to the changes in a parasitic capacitance between the different modes of normal operation. Additional details of the operation of the suppression component 220 are illustrated and described below with reference to FIG. 3.

In another embodiment, the output passive network 206 (as an impedance matching network) can be implemented with a single transformer. The single transformer for output passive network 206 include two inductors, one for magnetizing inductance and the other for leakage inductance, parasitic capacitors, and absorb the power amplifier output capacitors to provide a real impedance transformation or a flat-phase response to the PA 110' along a broad bandwidth (e.g., about 2.4 GHz to about 5.5 GHz, or other broad band). For example, the output passive network 206 can operate as a multi-resonance network to perform impedance matching, power combining, even harmonics suppression and differential to single-ended conversion across a wide frequency range (one octave) with a single transformer footprint. The output passive network 206 can further generate or provide a flat-phase response across a wide bandwidth or at least two different operating frequency bands (e.g., about 2 GHz and 5.5 GHz), so that a change in output capacitance due to the non-linear capacitance of the power amplifier leads to minimum signal phase change. The flat-phase response generated by the output passive network 206 can effectively suppress the AM-PM distortion. This leads to excellent AM-PM performance across the wide bandwidth range.

An advantage of the PA 110' is it utilizes the PA transistor (e.g., M3 and M4) inherent parasitic capacitance to self-compensate or linearize the non-linear capacitance variations, which provides a highly efficient and compact scheme at PA back-off modes of operation among or back forth between back-off and saturation mode. Compared to a multi-band PA which uses individual output matching networks, the proposed multi-band PA output stage utilizes only one compact passive transformer as the matching resonance network component 206, which can provide parallel output power combining, output impedance matching, even-order harmonic rejection and differential to single-ended conversion across a wide bandwidth without any lossy tunable passive elements or switches. Another advantage is that the PA 110' can significantly reduce the transmitter area by factor of 2× or more and maximize the PA efficiency. Additionally, for example, the proposed PA 110' architecture achieves excellent AM-PM characteristic (<3°), about 30~40% power added efficiency (PAE), with 2.05% error vector magnitude (EVM) and 256 quadrature amplitude modulation QAM and can cover the wide frequency range (1:2 range) with ultra-compact area which is the state-of-art performance among CMOS PAs.

Figure 3:
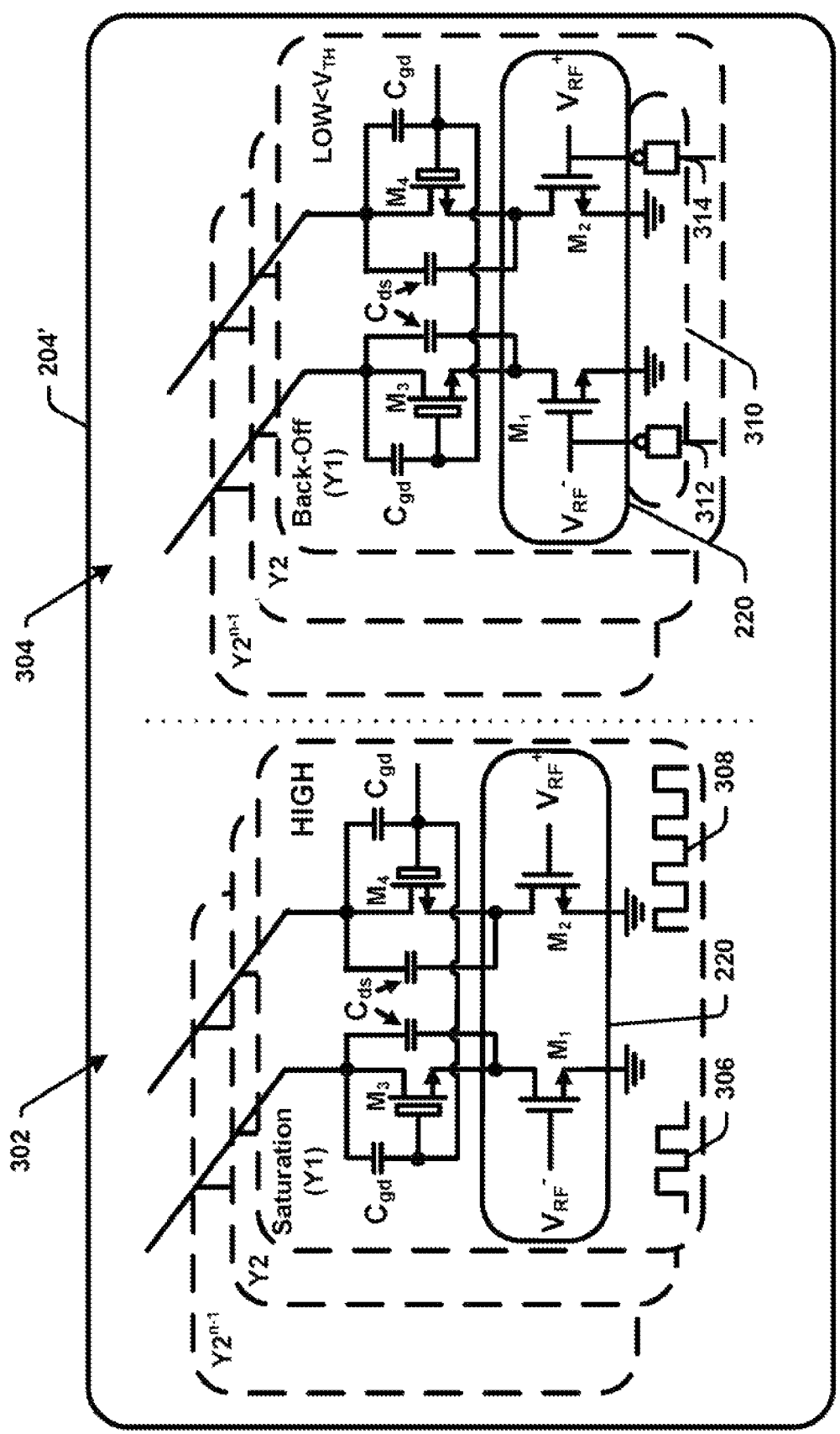
FIG. 3 illustrates a power amplifier component in accordance with various aspects described.

Referring to FIG. 3, illustrated is an additional example of a unit PA cell component 204 for a PA in accordance with various aspects or embodiments being described. Further, the PA component 204 or PA 110' discussed herein is not limited to digital PAs and can also be used with analog PAs, or a combination thereof. The example unit PA cell components 204 depicts operation of the output power networks Y1-Y2$^{n-1}$ in two different power stages that can change or alternatingly operate during different power levels of operation of the PA 110 or 200.

In one embodiment, the unit PA cell components 204' can operate to generate self-compensation or self-suppression of nonlinearities being generated by the parasitic capacitances generated by the different powering on and off modes (back-off or saturation modes). For example, a first power stage comprises the saturation (active) mode of operation 302 where the output power networks Y1-Y2$^{n-}$ of the unit PA cell components 204 operate with full or complete power above a threshold voltage so that the transistors M3 and M4 of any one of the networks Y1-Y2$^{n-1}$ are operational, and a channel has been created for current flow. This allows current to flow between the drain and source. Since the drain voltage is higher than the source voltage, the current flow of electrons spread out, and conduction is not through a narrow channel but through a broader, two- or three-dimensional current distribution extending away from the interface and deeper in the substrate.

In contrast, a back-off mode 304 of operation occurs when the power is decreased normally and power is backed off so that the transistors M3 and M4 are cut-off or in sub-threshold mode. While the current between drain and source should ideally be zero when the transistor is being used as a turned-off switch, there can be a weak-inversion current, sometimes called subthreshold leakage. The subthreshold I-V curve can depend exponentially upon threshold voltage, introducing a strong dependence on any manufacturing variation that affects threshold voltage, for example: variations in oxide thickness, junction depth, or body doping that change the degree of drain-induced barrier lowering. The resulting sensitivity to fabricational variations can complicate optimization for leakage and performance.

The unit PA cells 204 can comprise n-bit binary weighted power cells with a differential cascade amplifier topology. A digital switching PA scheme is illustrated in FIG. 3 that operates to turn-on/off the binary weighted unit power amplifier cells Y1-Y2$^{n-1}$ to control the amplitude. For example, when the unit PA cell (Y1) is turned-on in saturation/power mode 302, the cascade transistors (M3 and M4) can be biased at a high voltage (above a threshold voltage or a saturation power level) and the thin-gate transistors (M1 and M2) can be driven differentially (differential pulse 306 and 308 by the driver stage 202 of FIG. 2). When the unit PA cell (Y1) is turned-off in sub-threshold voltage or back-off mode 304, the cascade transistors (M3 and M4) can be biased at a low voltage (below a threshold voltage as LOW<$V_{TH}$). However, in response to the thin-gate transistors (M1 and M2) being turned off as well AM-PM distortion can exist.

In one embodiment, the suppression component 220 operates to take into consideration the Cds of the cascade transistors (M3 and M4), when the unit PA cells 204 are turned off (or power is decreasing in back-off mode). During back-off mode of operation only a small portion of Cds is loaded at the drain, as the thin-gate transistors are completely turned off and one terminal of the Cgd is effectively floating. When the power cell is turned-off or in back-off mode 304, the cascade transistors (M3 and M4) can be biased at a low voltage below a threshold voltage (<$V_{TH}$) to be weekly conducting, while the thin-gate transistors (M1 and M2) as the suppression component 220 are now completely turned on or fully powered. Thus, the Cds loads the drain of the cascade transistors (M3 and M4) entirely, so that off-state capacitance can be increased. The cascade transistors (M3 and M4) are thus still biased at sub-threshold region (<$V_{TH}$>) to minimize leakage in off state 304.

Consequently, the suppression component 220 can provide additional capacitance that can compensate the capacitance reduction of Cgd at power back-off of PA, without extra control bits when the power cells are turned-off (when PA power decreases and an effective capacitance Cdev decreases) for a self-suppression or compensation scheme. In other words, the total capacitance change resulting in AM-PM distortions is reduced and the unit PA cell compensates or suppresses nonlinearities by adding a parasitic capacitance by coupling the Cds to ground during the power off or back-off phases of operation. This compensation scheme can be performed without adding additional capacitors or capacitor components.

In another aspect, the suppression component 220 can comprise a detection component 310 and 312, which can include a set of switches or inverters 312 and 314, configured to detect the back-off power mode of operation from the saturation power mode of operation based on a power level of the first plurality of transistors. Based on a detection of the power level, the inverters 312 or 314 can operate the suppression component 220 to mitigate the non-linear behavior of the PA component 204' where the effective parasitic capacitance is decreasing as the power is decreasing and the self-compensating bias operations linearize the non-linear parasitic capacitance of the PA component 204'.

Figure 4:
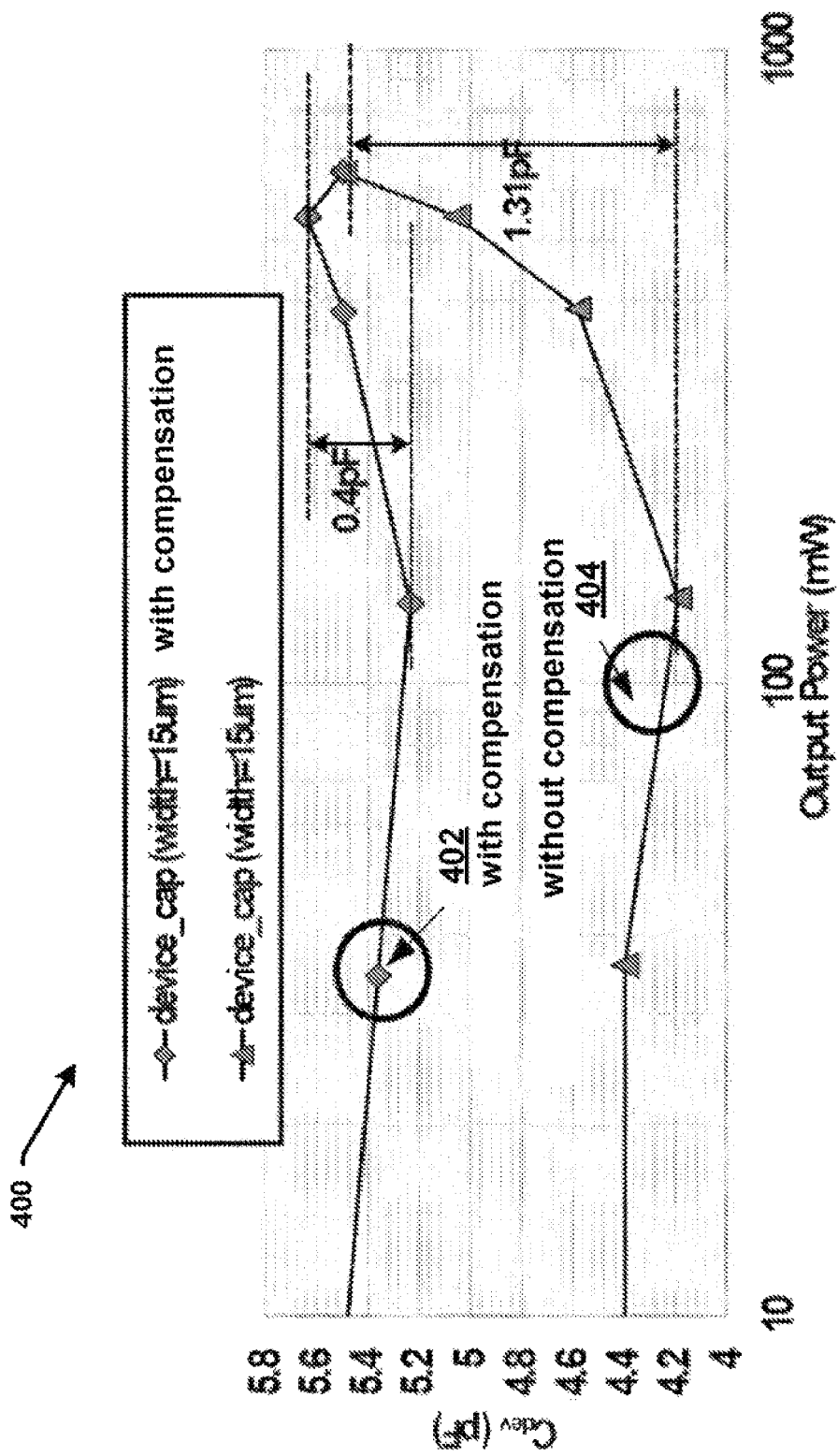
FIG. 4 illustrates an example graph of compensation and an output passive network in accordance with various aspects described.

Referring to FIG. 4, illustrated is an example result of a simulated self-compensation scheme together with the output passive network according to various aspects being described. The characteristics of behavior for the PA 110' capacitance can be seen from the simulation graph 400. The curve 402 demonstrates the differential between the total capacitance of the PA 110' during operation while the unit PA cells are off, low or in back-off, while processing transmission with self-suppression or a compensation scheme via the suppression component 220. The curve 404 demonstrates the differential between the total capacitance of the PA 110' during operating while the unit PA cells are off, or in back-off, while processing transmission without self-suppression or a compensation scheme via the suppression component 220. As such, FIG. 4 illustrates that the simulated PA 110' effective capacitance (Cdev) at the drain of the cascade transistors (M3 and M4) variation with the suppression components 220 self-compensation scheme is reduced to about 0.4 pF, while without the PA scheme about a 1.31 pF variation can result with an output power range from 10 mW to 640 mWm which is a source or cause of the AM-PM distortion. Therefore, reducing the total change in capacitance via the suppression component 220 self-compensates for the nonlinear capacitance and cuts the change in total capacitance between operating modes substantially by nearly half the total capacitance otherwise during back-off mode. The AM-PM distortion can be further minimized below 3° for example across a frequency range of 2.4 GHz to 6 GHz, which can cover most of commercial standard bands.

Figure 5:
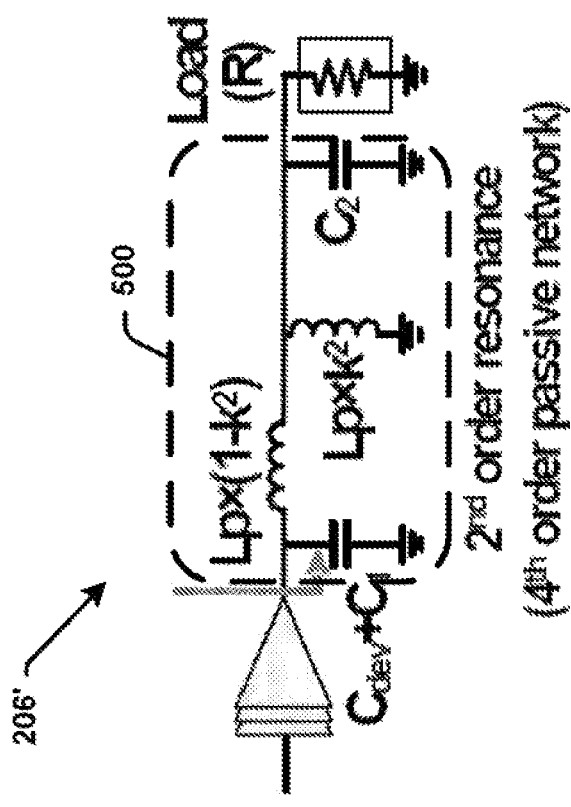
FIG. 5 illustrates an example output passive network in accordance with various aspects described.
Figure 6:
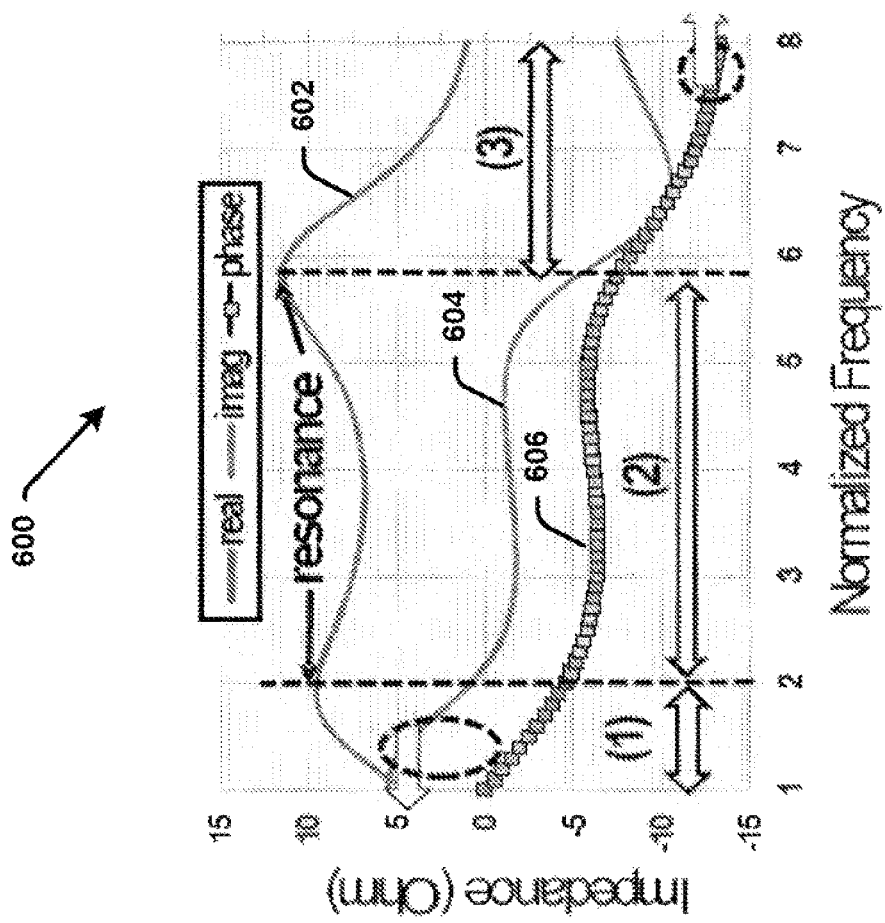
FIG. 6 illustrates an example simulation graph of related to an example power amplifier in accordance with various aspects described.

Referring to FIG. 5, illustrates is an example of the output passive network 206' in accordance with various aspects being described along with FIG. 6 illustrating an output simulation 600 with curves demonstrating effects of operations of the output passive network 206'. The output passive network 206' can operate as a multi-order resonance network that provides to a flat-phase response, in which the slope of the phase response is about zero ($\approx 0$) within the wide/broad frequency range.

The output passive network 206' can comprise a plurality of inductors and capacitors configured to provide a real impedance or a flat-phase response to the PA 110' or the unit PA cells Y1-Y2$^{n-1}$ in combination over a broad/wide bandwidth. The flat phase response is illustrated as a second phase (2) of the simulation 600. For example, the output passive network 206' can comprise a second-order resonance network that can resonate at two (or more) different frequencies (e.g., 2 GHz and 5.6 GHz). Due to the dual (or multi-) resonance of the output passive network 206', the flat-phase response is achieved across the frequency range within at least the two resonance frequencies. The flat-phase region (2) of FIG. 6 indicates a minimal phase variation with respect to loading capacitance variations (Cdev). As such, FIGS. 5 and 6 illustrate the schematic and simulation result of our proposed dual resonance (e.g., resonates at 2 GHz and 5.6 GHz) network clearly showing the flat phase response between about 2 GHz and 5.8 GHz. Other ranges can also be envisioned as one of ordinary skill in the art could appreciate.

The different inductors Lpx(1-k$^2$) and Lpxk$^2$ of the output passive network 206' can form or be realized as a single transformer 500 for a high-order LC matching network that generates a robust phase response or flat-phase response on the nonlinear capacitances of the PA 110', for example. The inductors and capacitors of the output passive network can be realized by the single transformer 500 by utilizing the parasitic components of a physical transformer and the non-linear parasitic capacitance of the PA component 204, for example.

The single transformer 500 can further operate to efficiently combine the power from the unit PA cells Y1-Y2$^{n-1}$ of the PA component 204 of FIG. 2, for example. As such, power can be efficiently delivered to an antenna 106 or load, for example, and AM-PM distortion be suppressed at the same time by the output passive network 206'. Because the PA 110', for example, provides different capacitance at different power levels, the output passive network 206' of the PA 110' can operate to make the phase response of the output passive network robust to the capacitance variations by utilizing the multi resonance operation over a wide operation band.

The curve 602 of FIG. 6 can represent an imaginary value or the capacitive curve. The curve 604 can represent the real value or the inductive curve. The curve 606 can represent the phase response curve with a flat response in section (2) within a wide band frequency operation range, for example. Conventionally, a 1st-order L-C resonance based output passive network can be widely used for a narrow band power amplifier. However, the phase response of the 1st-order L-C resonance network can be vulnerable to the loading capacitance variations (Cdev) as it directly shifts the resonance frequency, resulting in undesired phase shift/distortion. The slope of the phase response thus would depend on the loaded Q and the phase distortion due to the Cdev variation, and can be directly proportional to the slope of the phase response in this case. In contrast, the output passive network 206' generates a flat-phase response across a frequency range within at least two resonance frequencies of different resonance frequencies of signals of different operating bands. This provides a robust phase response to the non-linear capacitance variation of the PA 110'.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 7:
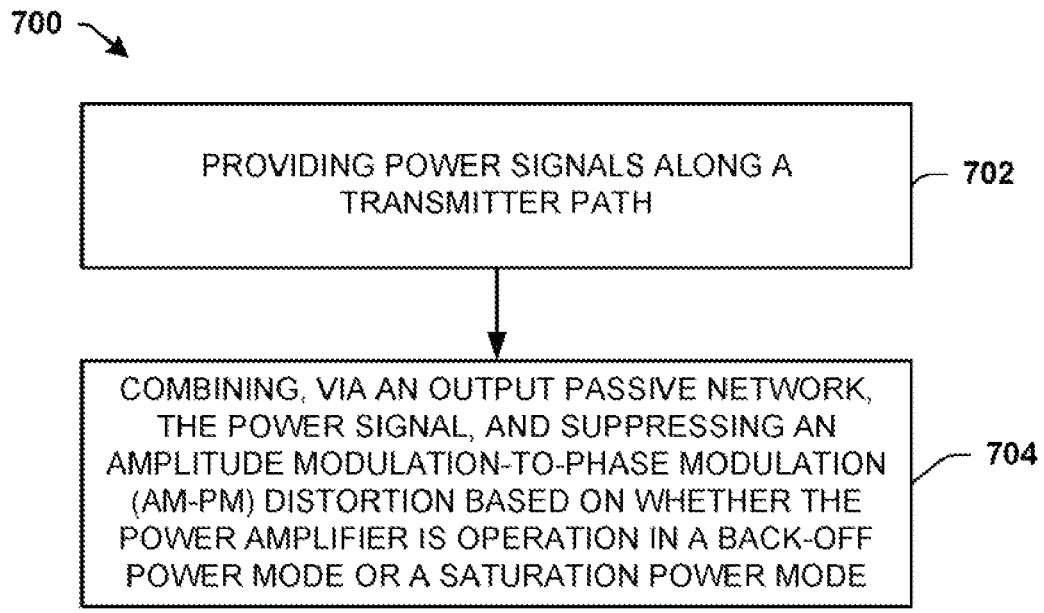
FIG. 7 illustrates a flow diagram of an exemplary method in accordance with various aspects described.

Referring to FIG. 7, illustrated is an example method for utilizing a PA circuit with AM-PM distortion compensation via an output passive network for a communication device (e.g., a mobile device, or user equipment). The method 700 initiates at 702 with providing, via a power amplifier, power signals along a transmitter path.

At 704, the method comprises combining, via an output passive network, the power signals, and suppressing an amplitude modulation-to-phase modulation (AM-PM) distortion based on whether the power amplifier is operation in a back-off power mode or a saturation power mode. The combining, via the output passive network, the power signals comprises combining the power signals from unit power amplifier cells and providing an optimum impedance to the power amplifier with a broad bandwidth via a single transformer.

The method can further include adjusting a bias of a capacitive unit in a unit power amplifier cell of the power amplifier to minimize an overall capacitance variation in the back-off power mode by utilizing an inherent parasitic capacitance of the power amplifier component to self-compensate a nonlinear capacitance variation at the output.

The method can include the output passive network 206 generating a flat-phase response across a frequency range within at least two resonance frequencies of the different resonance frequencies of the output passive network.

Providing the power signal along the transmitter path can further comprise operating in the back-off power mode and the saturation power mode alternatingly or sequentially, and in the back-off power mode increasing a capacitance of a first plurality of transistors at respective drain terminals, while decreasing the capacitance (e.g., an effective or differential capacitance) in the saturation power mode. A second plurality of transistors, having a smaller gate than the first plurality of transistors can be provided and coupled at the drains of the first plurality of transistors, while the first plurality of transistors operate in a below threshold voltage region.

Figure 8:
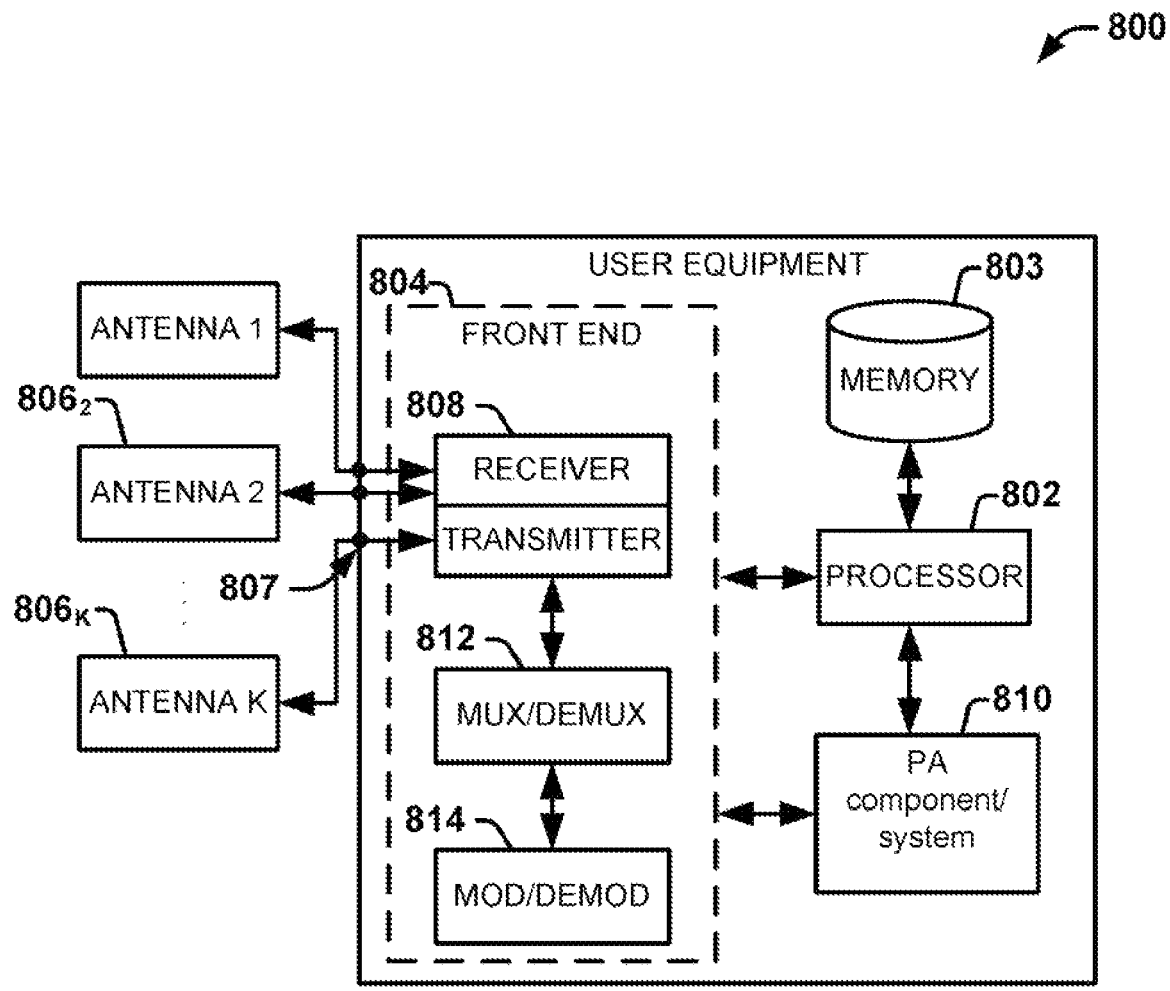
FIG. 8 illustrates an exemplary mobile communication device having a power amplifier component system in accordance with various aspects described.

To provide further context for various aspects of the disclosed subject matter, FIG. 8 illustrates a block diagram of an embodiment of access equipment, user equipment (e.g., a mobile device, communication device, personal digital assistant, etc.) or software 800 related to access of a network (e.g., base station, wireless access point, femtocell access point, and so forth) that can enable and/or exploit features or aspects of the disclosed aspects.

The user equipment or mobile communication device 800 can be utilized with one or more aspects of the converter systems or devices described according to various aspects herein. The mobile communication device 800, for example, comprises a digital baseband processor 802 that can be coupled to a data store or memory 803, a front end 804 (e.g., an RF front end, an acoustic front end, or the other like front end) and a plurality of antenna ports 807 for connecting to a plurality of antennas 806$_1$ to 806$_k$ (k being a positive integer). The antennas 806$_1$ to 806$_k$ can receive and transmit signals to and from one or more wireless devices such as access points, access terminals, wireless ports, routers and so forth, which can operate within a radio access network or other communication network generated via a network device (not shown). The user equipment 800 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 804 can include a communication platform, which comprises electronic components and associated circuitry that provide for processing, (e.g., manipulation or shaping of the received or transmitted signals via one or more receivers or transmitters 808, a mux/demux component 812, and a mod/demod component 814. The front end 804, for example, is coupled to the digital baseband processor 802 and the set of antenna ports 807, in which the set of antennas 806$_1$ to 806$_k$ can be part of the front end. In one aspect, the mobile communication device 800 can comprise a PA component/system 810 according to embodiments/aspects described herein.

The user equipment device 800 can also include a processor 802 or a controller that can operate to provide or control one or more components of the mobile device 800. For example, the processor 802 can confer functionality, at least in part, to substantially any electronic component within the mobile communication device 800, in accordance with aspects of the disclosure. As an example, the processor can be configured to execute, at least in part, executable instructions that control various modes or components of the PA component/system 810 (e.g., the system 110, 200, 110, 110', or 204).

The processor 802 can operate to enable the mobile communication device 800 to process data (e.g., symbols, bits, or chips) for multiplexing/demultiplexing with the mux/demux component 812, or modulation/demodulation via the mod/demod component 814, such as implementing direct and inverse fast Fourier transforms, selection of modulation rates, selection of data packet formats, inter-packet times, etc. Memory 803 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

The processor 802 is functionally and/or communicatively coupled through a memory bus) to memory 803 in order to store or retrieve information necessary to operate and confer functionality, at least in part, to communication platform or front end 804, the PA component/system 810 and substantially any other operational aspects described herein.

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a communication system comprising: a power amplifier comprising a plurality of unit power amplifier cells configured to provide a power signal along a transmitter path, and an output passive network component configured to combine power signals from the plurality of unit power amplifier cells and suppress an amplitude modulation-to-phase modulation (AM-PM) distortion.

Example 2 includes the subject matter of Example 1, further comprising: a detection component configured to detect a back-off power mode from a saturation power mode based on a power level of the output.

Example 3 includes the subject matter of any of Examples 1-2, including or omitting any elements, further comprising: a suppression component configured to adjust a bias of a unit power amplifier cell of the power amplifier to minimize an overall capacitance variation in a full operating power range.

Example 4 includes the subject matter of any of Examples 1-3, including or omitting any elements, wherein the suppression component is further configured to utilize an inherent parasitic capacitance of the power amplifier to self-compensate a nonlinear capacitance variation at the output.

Example 5 includes the subject matter of any of Examples 1-4, including or omitting any elements, wherein the output passive network component comprises a matching network configured to generate an output impedance matching operation with a single transformer by using parasitic components of the single transformer to generate broadband impedance transformation and suppress the AM-PM distortion.

Example 6 includes the subject matter of any of Examples 1-5, including or omitting any elements, wherein the output passive network component comprises a plurality of capacitors and an inductor configured to provide real impedance with a flat-phase response to the power amplifier along a broad bandwidth to suppress the AM-PM distortion.

Example 7 includes the subject matter of any of Examples 1-6, including or omitting any elements, wherein the plurality of capacitors and the inductor of the output passive network component are realized by a single transformer by utilizing parasitic components of the single transformer and a non-linear parasitic capacitance of the power amplifier.

Example 8 includes the subject matter of any of Examples 1-7, including or omitting any elements, wherein the matching network is further configured to generate a flat-phase response across a frequency range within at least two resonance frequencies of different resonance frequencies of the matching network, wherein the matching network comprises a robust phase response to a non-linear capacitance variation of the power amplifier.

Example 9 is a mobile communication device comprising: a power amplifier comprising a plurality of unit power amplifier cells, configured to provide a power signal to a signal processing path, comprising an output power stage, and an output passive network of the output power stage configured to combine the power signal and suppress an amplitude modulation-phase modulation (AM-PM) distortion in a back-off power mode of operation from a saturation power mode of operation.

Example 10 includes the subject matter of any of Example 9, including or omitting any elements, wherein the plurality of unit power amplifier cells provide power signals for a desired power to the output passive network, wherein the power amplifier comprises a parasitic capacitance that has a non-linear behavior with respect to a power level, wherein the parasitic capacitance decreases as power is decreasing and a suppression component is configured to provide a self-compensating bias scheme that linearizes the parasitic capacitance of the power amplifier.

Example 11 includes the subject matter of any of Examples 9-10, including or omitting any elements, further comprising: a suppression component configured to adjust a bias of a capacitive unit in a unit power amplifier cell of the plurality of unit power amplifier cells to linearize a non-linear behavior of a parasitic capacitance of the unit power amplifier cell.

Example 12 includes the subject matter of any of Examples 9-11, including or omitting any elements, wherein the suppression component is further configured to compensate for an effective capacitance reduction in the back-off power mode of operation of the power amplifier by using a parasitic capacitance of a first plurality of transistors via a second plurality of transistors coupled to drain terminals of the first plurality of transistors.

Example 13 includes the subject matter of any of Examples 9-12, including or omitting any elements, wherein in a back-off power mode of operation, a first plurality of transistors of the power amplifier is configured to comprise a lower voltage and, in the saturation power mode of operation, the first plurality of transistors comprises a saturation voltage.

Example 14 includes the subject matter of any of Examples 9-13, including or omitting any elements, further comprising: a suppression component comprising a second plurality of transistors, coupled to the first plurality of transistors, configured to be fully powered in the back-off power mode of operation, and a detection component, comprising a set of switches, configured to detect the back-off power mode of operation from the saturation power mode of operation based on a power level of the first plurality of transistors.

Example 15 includes the subject matter of any of Examples 9-14, including or omitting any elements, wherein the suppression component is configured to bias the first plurality of transistors of the output power stage while operating below an operational voltage threshold during the back-off power mode of operation.

Example 16 includes the subject matter of any of Examples 9-15, including or omitting any elements, wherein the output passive network component comprises a matching network configured to generate an output impedance matching operation with a single transformer by using parasitic components of the single transformer to generate broadband impedance transformation and suppress the AM-PM distortion.

Example 17 includes the subject matter of any of Examples 9-16, including or omitting any elements, wherein the matching network is further configured to resonate at different resonance frequencies and generate a flat phase response across a frequency range within at least two resonance frequencies of the different resonance frequencies.

Example 18 includes the subject matter of any of Examples 9-17, including or omitting any elements, wherein the power amplifier comprises the plurality of unit power amplifier cells configured to provide a power signal along the signal processing path according to different operating bands.

Example 19 is a method for a communication system comprising: providing, via a power amplifier, power signals along a transmitter path, and combining, via an output passive network, the power signals, and suppressing an amplitude modulation-to-phase modulation (AM-PM) distortion based on whether the power amplifier is operation in a back-off power mode or a saturation power mode.

Example 20 includes the subject matter of Examples 19, including or omitting any elements, further comprising: adjusting a bias of a capacitive unit in a unit power amplifier cell of the power amplifier to minimize an overall capacitance variation in the back-off power mode by utilizing an inherent parasitic capacitance of the power amplifier component to self-compensate a nonlinear capacitance variation at the output.

Example 21 includes the subject matter of any of Examples 19-20, including or omitting any elements, wherein the combining, via the output passive network, the power signals comprises combining the power signals from unit power amplifier cells and providing an optimum impedance to the power amplifier with a broad bandwidth via a single transformer.

Example 22 includes the subject matter of any of Examples 19-21, including or omitting any elements, further comprising: generating a flat-phase response across a frequency range within at least two resonance frequencies of the different resonance frequencies of the output passive network.

Example 23 includes the subject matter of any of Examples 19-22, including or omitting any elements, wherein providing the power signal along the transmitter path comprises operating in the back-off power mode and the saturation power mode alternatingly, and in the back-off power mode increasing a capacitance of a first plurality of transistors at respective drain terminals, and decreasing the capacitance in the saturation power mode.

Example 24 includes the subject matter of any of Examples 19-23, including or omitting any elements, further comprising: powering a second plurality of transistors, having a smaller gate than the first plurality of transistors and coupled at the drains of the first plurality of transistors, while the first plurality of transistors operate in a below threshold voltage region.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

What is claimed is:

1. An apparatus for amplifying radio frequency signals, comprising:
    a plurality of differential amplifier cells coupled to an output passive network;
        wherein at least one differential amplifier cell of the plurality of differential amplifier cells comprises a first pair of cascode transistors and a second pair of transistors;
        wherein the second pair of transistors comprises a smaller sized gate than the first pair of cascode transistors;
    digital circuitry configurable to power on or off at least one pair of cascode transistors; and
    a driver stage to generate driver signals for the plurality of differential amplifier cells.

2. The apparatus of claim 1, wherein the driver stage comprises one or more driver stage cells.

3. The apparatus of claim 2, wherein the driver stage cells include one or more amplifiers.

4. The apparatus of claim 2, wherein the driver stage cells include one or more comparators.

5. The apparatus of claim 1, wherein the digital circuitry is configured to control the differential amplifier cells by providing bias signals to gates of the transistors.

6. The apparatus of claim 1, wherein the digital circuitry is configured to control the differential amplifier cells by providing a voltage bias to the gates of the cascode transistors.

7. The apparatus of claim 1, wherein the output passive network comprises at least one transformer.

8. The apparatus of claim 1, wherein the output passive network comprises at least one capacitive unit.

9. The apparatus of claim 7, wherein the transformer and the plurality of differential amplifier cells are coupled in parallel to one another.

10. The apparatus of claim 1, further comprising: a set of switches or inverters coupled to the second pair of transistors and configured to selectively enable a power level of the second pair of transistors via the digital circuitry and based on a threshold voltage.

11. The apparatus of claim 1, wherein the digital circuitry is configured to
    power on the at least one pair of cascode transistors by biasing over a threshold voltage, and
    to power off the at least one pair of cascode transistors by biasing under a threshold voltage.

12. The apparatus of claim 1, wherein the smaller sized gate has a smaller gate width.

13. The apparatus of claim 1, wherein the digital circuitry is configurable to power on or off pairs of cascode transistors of a select subset of the differential amplifier cells.

14. The apparatus of claim 1, wherein the plurality of differential amplifier cells are part of a power amplifier circuit.

15. A power amplifier for a mobile device for amplifying radio frequency signals, comprising:
    a plurality of differential amplifier cells coupled to an output passive network;
    wherein at least one differential amplifier cell of the plurality of differential amplifier cells comprises a first pair of cascode transistors and a second pair of transistors;
    wherein the second pair of transistors comprises a smaller sized gate than the first pair of cascode transistors;

digital circuitry configurable to power on or off at least one pair of cascode transistors; and a driver stage for generating driver signals for the plurality of differential amplifier cells.

16. A method for operating an apparatus for amplifying radio frequency signals having a plurality of differential amplifier cells coupled to an output passive network, wherein at least one differential amplifier cell of the plurality of differential amplifier cells comprises a first pair of cascode transistors and a second pair of transistors;

wherein the second pair of transistors comprises a smaller sized gate than the first pair of cascode transistors the method comprising:

providing bias signals to gates of the transistors; and providing a voltage bias to the gates of the cascode transistors.

17. The method of claim 16, further comprising: selectively enabling a power level of the transistors based on a threshold voltage.

18. The method of claim 16, further comprising: powering on or off pairs of cascode transistors of a select subset of the plurality differential amplifier cells.

19. The method of claim 16, further comprising:

powering on the at least one pair of cascode transistors by biasing over a threshold voltage, and powering off the at least one pair of cascode transistors by biasing under a threshold voltage.

20. User equipment or mobile communication device comprising an apparatus for amplifying radio frequency signals, the apparatus comprising:

a plurality of differential amplifier cells coupled to an output passive network, wherein at least one differential amplifier cell of the plurality of differential amplifier cells comprises a first pair of cascode transistors and a second pair of transistors, wherein the second pair of transistors comprises a smaller sized gate than the first pair of cascode transistors;

digital circuitry configurable to power on or off at least one pair of cascode transistors; and a driver stage to generate driver signals for the plurality of differential amplifier cells.

* * * * *